United States Patent
Beaulaton et al.

(10) Patent No.: US 9,823,074 B2
(45) Date of Patent: Nov. 21, 2017

(54) MICRO-ELECTRO-MECHANICAL SYSTEM DRIVE-MODE OSCILLATOR MODULE AND METHOD THEREFOR

(75) Inventors: Hugues Beaulaton, Toulouse (FR); Laurent Cornibert, Toulouse (FR); Gerhard Trauth, Muret (FR)

(73) Assignee: NXP USA, Inc., Austin, TX (US)

( * ) Notice: Subject to any disclaimer, the term of this patent is extended or adjusted under 35 U.S.C. 154(b) by 25 days.

(21) Appl. No.: 14/416,727

(22) PCT Filed: Aug. 8, 2012

(86) PCT No.: PCT/IB2012/001817
§ 371 (c)(1),
(2), (4) Date: Jan. 23, 2015

(87) PCT Pub. No.: WO2014/023993
PCT Pub. Date: Feb. 13, 2014

(65) Prior Publication Data
US 2015/0185011 A1    Jul. 2, 2015

(51) Int. Cl.
*G01C 19/5712* (2012.01)
*G01C 19/5776* (2012.01)
*H03B 28/00* (2006.01)

(52) U.S. Cl.
CPC ..... *G01C 19/5712* (2013.01); *G01C 19/5776* (2013.01); *H03B 28/00* (2013.01); *H03B 2200/0082* (2013.01)

(58) Field of Classification Search
CPC ............ G01C 19/5776; H03B 2200/003
USPC ............................................. 73/504.12
See application file for complete search history.

(56) References Cited

U.S. PATENT DOCUMENTS

| | | | | |
|---|---|---|---|---|
| 5,041,802 A * | 8/1991 | Wei | ........................ | H03K 3/014 331/116 FE |
| 6,220,094 B1 * | 4/2001 | Ichinose | ............ | G01C 19/5607 73/1.77 |
| 7,188,523 B2 * | 3/2007 | Wyse | ................. | G01C 19/5719 73/1.38 |
| 7,197,930 B2 * | 4/2007 | Sugiki | ..................... | G01C 19/56 73/504.04 |
| 7,446,615 B2 * | 11/2008 | Okuda | ....................... | G06F 1/08 331/16 |
| 7,467,320 B2 * | 12/2008 | Chang | ....................... | G06F 1/06 713/501 |

(Continued)

OTHER PUBLICATIONS

International Search Report and Written Opinion correlating to PCT/IB2012/001817 dated Apr. 15, 2013.

*Primary Examiner* — Lisa Caputo
*Assistant Examiner* — Tran M Tran

(57) ABSTRACT

A drive-mode oscillator module for use within a micro-electro-mechanical system (MEMS) device is described. The drive-mode oscillator module is arranged to receive a proof-mass measurement signal from a proof-mass of the MEMS device and to output a proof-mass actuation signal to the proof-mass of the MEMS device. The drive-mode oscillator module comprises a first, higher gain accuracy drive-mode component for generating an actuation signal to be output by the drive-mode oscillator module during an active mode of the MEMS device, and a second, lower power consumption drive-mode component for generating an actuation signal to be output by the drive-mode oscillator module during a standby mode of the MEMS device.

17 Claims, 3 Drawing Sheets

(56) References Cited

U.S. PATENT DOCUMENTS

| | | | | |
|---|---|---|---|---|
| 7,605,652 B2* | 10/2009 | Beaulaton | .................. | H03F 1/02 330/141 |
| 7,642,869 B2* | 1/2010 | Fujii | ........................ | G06F 1/08 327/291 |
| 7,812,681 B2* | 10/2010 | Kanai | ................. | G01C 19/5649 331/116 R |
| 7,849,744 B2* | 12/2010 | Kanai | ................. | G01C 19/5649 310/317 |
| 7,849,746 B2* | 12/2010 | Kanai | .................... | G01C 19/56 331/109 |
| 8,026,771 B2* | 9/2011 | Kanai | .................... | G01C 19/56 331/158 |
| 8,115,544 B2* | 2/2012 | Trauth | ..................... | H03F 1/30 330/307 |
| 8,156,805 B2* | 4/2012 | Hayner | .................. | G01C 19/56 329/360 |
| 8,166,817 B2* | 5/2012 | Chen | .................. | G01C 19/5726 702/145 |
| 8,183,944 B2* | 5/2012 | Seeger | ..................... | H03B 5/30 331/116 M |
| 8,217,726 B2* | 7/2012 | Sako | ........................ | H03B 5/36 331/116 R |
| 8,474,317 B2* | 7/2013 | Rizzo Piazza Roncoroni | ........... | G01C 19/56 331/154 |
| 8,539,834 B2* | 9/2013 | Prandi | ................ | G01C 19/5726 73/504.12 |
| 8,714,012 B2* | 5/2014 | Caminada | .......... | G01C 19/5762 73/504.12 |
| 8,800,369 B2* | 8/2014 | Caminada | .......... | G01C 19/5726 73/504.12 |
| 8,847,693 B2* | 9/2014 | Seeger | .................... | H03B 5/30 331/116 M |
| 8,960,001 B2* | 2/2015 | Rizzo Piazza Roncoroni | ........... | G01C 19/56 73/504.12 |
| 9,046,366 B2* | 6/2015 | Yanagisawa | ....... | G01C 19/5649 |
| 9,091,539 B2* | 7/2015 | Hanson | .................. | G01C 19/00 |
| 9,097,525 B2* | 8/2015 | Cazzaniga | .......... | G01C 19/5762 |
| 9,116,562 B2* | 8/2015 | Beaulaton | ................ | G06F 1/04 |
| 2008/0178672 A1 | 7/2008 | Kanai et al. | | |
| 2016/0102979 A1* | 4/2016 | Beaulaton | ............. | H01L 41/042 73/504.12 |

\* cited by examiner

MICRO-ELECTRO-MECHANICAL SYSTEM DRIVE-MODE OSCILLATOR MODULE AND METHOD THEREFOR

FIELD OF THE INVENTION

The field of this invention relates to a drive-mode oscillator module for use within a micro-electro-mechanical system (MEMS) device and method therefor.

BACKGROUND OF THE INVENTION

A gyroscope is a sensor that measures the rate of rotation of an object. The concept of a vibrating MEMS (Micro-Electro-Mechanical System) gyroscope is to generate the momentum of a proof-mass to induce and detect the Coriolis force. A Coriolis force is applied to the proof-mass in motion when an angular rate is applied. The Coriolis force Fc is the product of the proof-mass 'm', the input rate 'Ω' and the mass velocity 'v'. The direction of the Coriolis force is perpendicular to the proof-mass.

The basic architecture of a vibratory gyroscope is comprised of a drive-mode oscillator that generates and maintains a constant linear momentum of the proof-mass, and a sense mode circuit that measures the sinusoidal Coriolis force induced due to the combination of the drive oscillation and any angular rate input. The majority of rate gyroscopes utilize a vibratory proof-mass suspended by springs above a substrate. The objective being to form a vibratory drive oscillator coupled to an orthogonal sense system detecting the Coriolis force.

Since the Coriolis Effect is based on conservation of momentum, the drive-mode oscillator circuit is implemented to provoke the oscillation of the proof-mass which is the source of this momentum.

FIG. 1 illustrates a simplified block diagram of an example of such a drive-mode oscillator circuit 100. The drive-mode oscillator circuit 100 in the illustrated example comprises a capacitance to voltage (C2V) circuit 110 arranged to convert a capacitance change of a MEMS drive measurement unit (DMU) (not shown) caused by the displacement of the proof-mass to a voltage measurement signal. An integrator 120 receives the voltage measurement signal and phase shifts it by, for example, 90° to compensate for the phase lag of the MEMS. A voltage gain amplifier (VGA) 130 receives the phase shifted voltage signal and outputs an actuation voltage signal to a drive actuation unit (DAU) (not shown) of the MEMS. An automatic gain control (AGC) circuit 140 provides a control signal to the VGA 130 to control the amplitude of the actuation voltage signal output thereby.

When a MEMS gyroscope is initially turned on, it takes a significant amount of time to achieve an oscillating displacement range for the proof-mass required for obtaining meaningful measurements. In order to avoid delays in the use of such MEMS gyroscopes, it is known to implement a 'standby mode' in which oscillation of the proof-mass is maintained by the drive-mode oscillator circuit, whilst the sensing circuit(s) is/are powered down to conserve power. Such a standby mode is also known as 'drive-running mode', 'ready-mode', 'sleep-mode', etc.

However, maintaining such a drive-mode oscillator circuit powered up and driving the proof-mass still consumes a significant amount of power, which in many electronic applications is undesirable.

SUMMARY OF THE INVENTION

The present invention provides a drive-mode oscillator module for use within a micro-electro-mechanical system, MEMS, device and a method of generating an actuation signal for a proof-mass within an micro-electro-mechanical system, MEMS, device as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Figure 1:
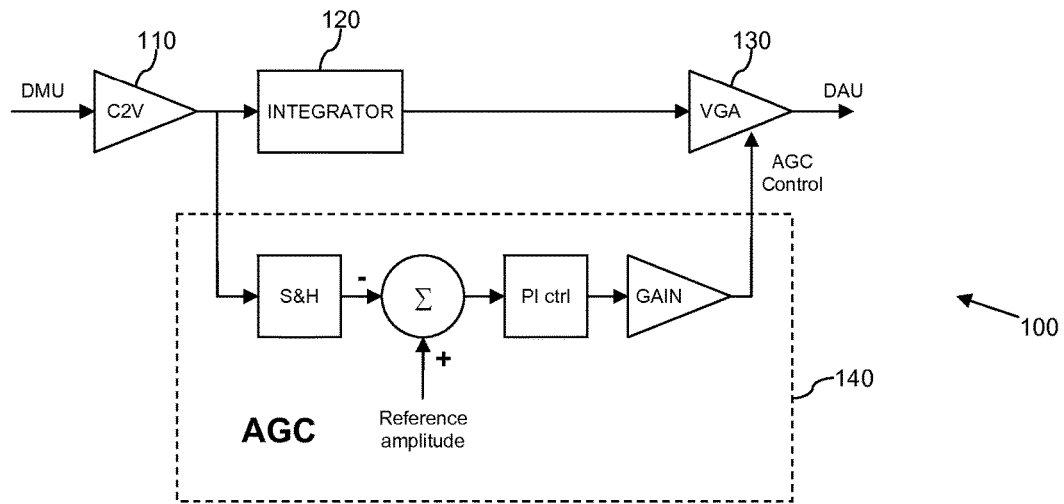
FIG. 1 illustrates a simplified block diagram of an example of a drive-mode oscillator circuit.

The present invention will now be described with reference to the accompanying drawings. However, it will be appreciated that the present invention is not limited to the specific examples herein described and illustrated in the drawings. Furthermore, because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Figure 2:
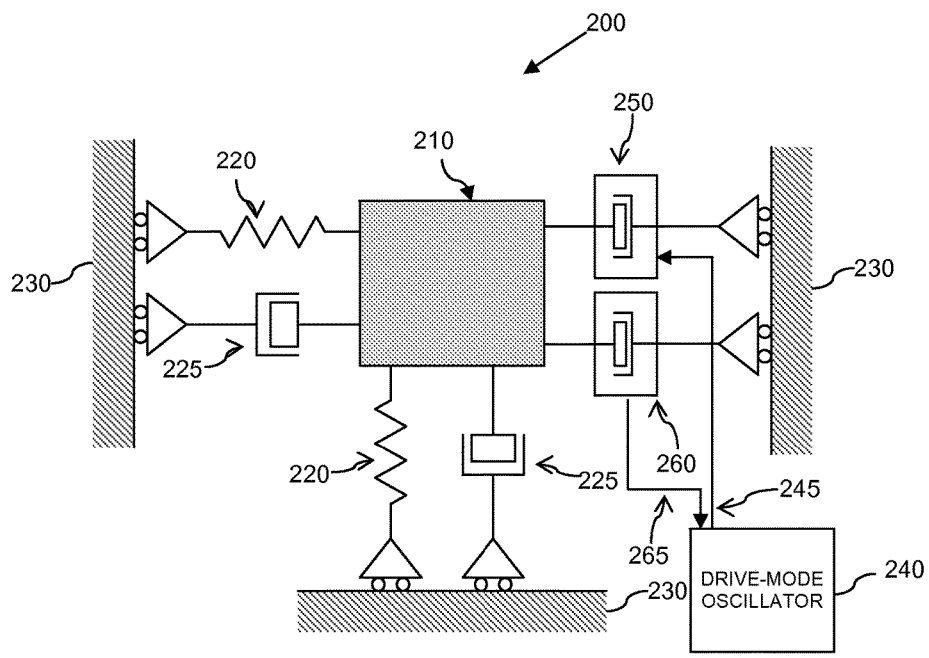
FIG. 2 illustrates a simplified block diagram of an example of a Micro-Electro-Mechanical System (MEMS) device.

Referring first to FIG. 2, there is illustrated a simplified block diagram of an example of a Micro-Electro-Mechanical System (MEMS) device 200. The MEMS device 200 comprises a vibratory proof-mass 210 suspended by springs 220 and damped by pistons 225 above one or more substrates 230. A drive-mode oscillator 240 generates an actuation signal 245, which drives a drive actuation unit (DAU) 250 of the MEMS device 200 to cause the proof-mass 210 to oscillate. A drive measurement unit (DMU) 260 of the MEMS device 200 outputs a proof-mass measurement signal 265 comprising an indication of a capacitance change therein caused by the displacement of the proof-mass 210. The proof-mass measurement signal 265 is provided as feedback to the drive-mode oscillator 240.

Figure 3:
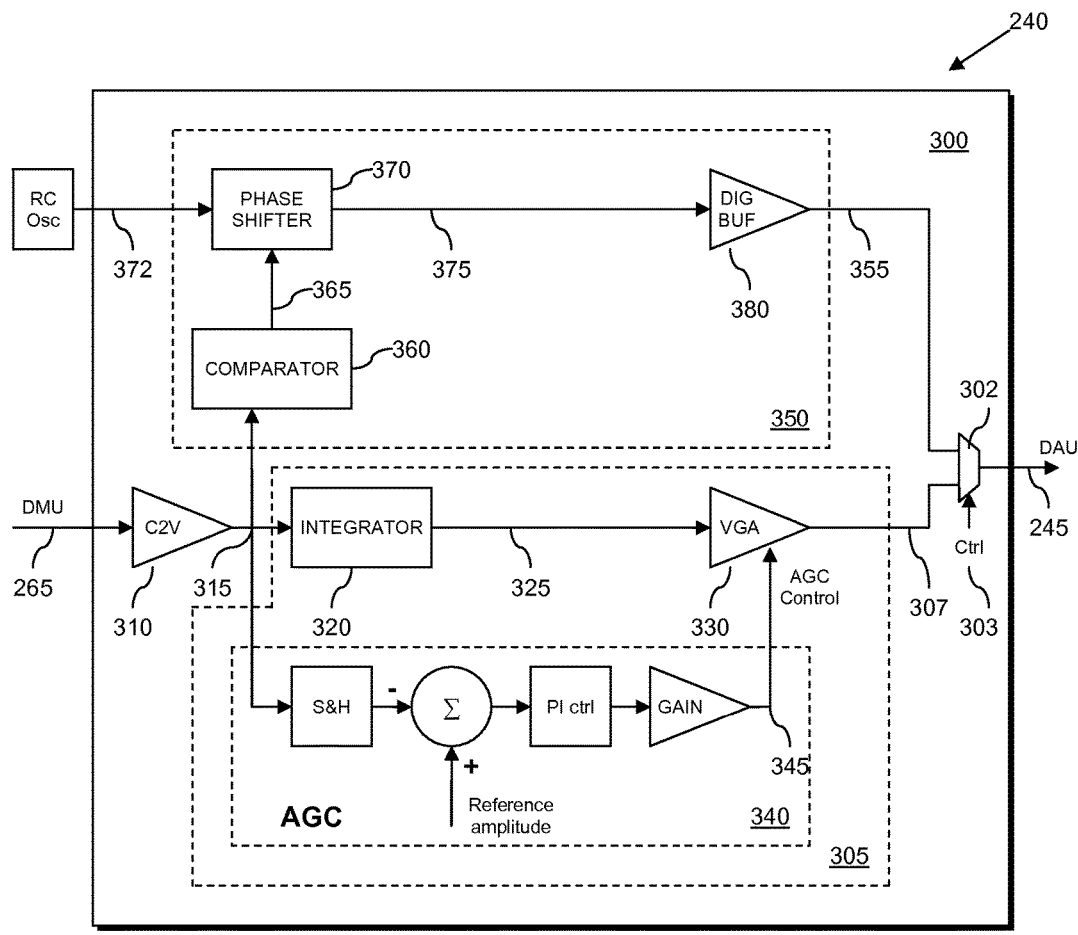
FIG. 3 illustrates a simplified block diagram of an example of a drive-mode oscillator module for use within a MEMS device.

Referring now to FIG. 3, there is illustrated a simplified block diagram of an example of a drive-mode oscillator module 240 for use within a MEMS device, such as may be used to implement the drive-mode oscillator 240 of the MEMS device 200 illustrated in FIG. 2. The drive-mode oscillator module 240 illustrated in FIG. 3 is implemented within an integrated circuit device 300 comprising at least one die within a single integrated circuit package. The drive-mode oscillator module 240 is arranged to receive a proof-mass measurement signal 265 from the DMU 260 of the proof-mass 210 of the MEMS device 200, and to output a proof-mass actuation signal 245 to the DAU 250 of the proof-mass 210 of the MEMS device 200. As such, the drive-mode oscillator module 240 in the illustrated example comprises a capacitance to voltage (C2V) module 310 arranged receive the proof-mass measurement signal 265 from the DMU 260 and convert the indicated capacitance change of the DMU 260 caused by the displacement of the proof-mass 210 to an analogue voltage measurement signal 315.

The drive-mode oscillator module 240 illustrated in FIG. 3 comprises a first, higher gain accuracy drive-mode component 305 for generating an actuation signal 307 to be output by the drive-mode oscillator module 240 during an active mode of the MEMS device 200. For clarity, an active mode may be considered to comprise, for example, an operating mode of the MEMS device 200 when a Coriolis force applied to the proof-mass 210 is required to be measured, or other similar measurement relating to the proof-mass is required to be measured.

In the illustrated example, the first, higher gain accuracy drive-mode component 310 comprises an analogue oscillator circuit, and in particular comprises an integration component 320 arranged to receive the analogue voltage measurement signal 315 output by the C2V module 310 and to phase shift the voltage measurement signal 315 by, for example, 90° to compensate for the phase lag of the MEMS device 200. In this manner, the integration component 320 outputs a phase shifted voltage signal 325. A voltage gain amplifier (VGA) 330 receives the phase shifted voltage signal 325 and outputs the actuation voltage signal 307. An automatic gain control (AGC) circuit 340 provides a control signal 345 to the VGA 330 to control the amplitude of the actuation voltage signal 307 output thereby.

Thus, in the illustrated example, the first, higher gain accuracy drive-mode component 305 comprises an analogue oscillator circuit that may be implemented within a substantially conventional drive-mode oscillator, and as such is capable of providing a high accuracy gain for the proof-mass actuation signal 245 required during an active mode of the MEMS device 200, for example when measuring a Coriolis force applied to the proof-mass 210 etc. It will be appreciated that any suitable alternative high gain accuracy drive-mode circuit arrangement may equally be implemented for the first, higher gain accuracy drive-mode component 305, and the present invention is not limit to the specific circuit arrangement therefor illustrated in FIG. 3.

The drive-mode oscillator module 240 further comprises a second, lower power consumption drive-mode component 350 for generating an actuation signal 355 to be output by the drive-mode oscillator module 240 during a standby mode of the MEMS device 200. For clarity, a standby mode, also known as 'drive-running mode', 'ready-mode', 'sleep-mode', may be considered to comprise, for example, an operating mode of the MEMS device 200 in which oscillation of the proof-mass 210 is maintained by the drive-mode oscillator module 240, whilst one or more sensing circuit(s) (not shown) of the MEMS device 200 may be powered down to conserve power.

Advantageously, by providing such a second, lower power consumption drive-mode component 350 for generating an actuation signal 355 to be output by the drive-mode oscillator module 240 during a standby mode of the MEMS device 200, the first, higher gain accuracy drive-mode component 310 may also be powered down during a standby mode of the MEMS device 200, thereby enabling power consumption within the MEMS device 200 to be further reduced during a standby mode. In the illustrated example, the drive-mode oscillator module 240 comprises a selector component 302, for example in a form of a multiplexer device or the like, arranged to selectively output as the proof-mass actuation signal 245 one of the actuation signals 307, 355 output by the first and second drive-mode components 305, 350 in accordance with a control signal 303.

In the illustrated example, the second, lower power consumption drive-mode component 350 comprises a digital oscillator circuit. In particular, the second, lower power consumption drive-mode component 350 comprises a comparator component 360 arranged to receive the analogue voltage measurement signal 315 output by the C2V module 310, and to output an equivalent square wave signal 365. The second, lower power consumption drive-mode component 350 further comprises a digital phase shifter component 370 arranged to receive the square wave signal 365 output by the comparator component 360 and a digital clock signal 372 comprising a higher frequency than the natural oscillating frequency of the proof-mass 210, and to output a phase shifted digital signal 375. In this manner, the digital square wave signal 365 may be phase shifted, for example by 90°, to compensate for the phase lag of the MEMS device 200. The phase shifted signal digital signal 375 is the provided to a digital buffer component 380 arranged to receive the phase shifted digital signal 375 and to output the actuation signal 350 corresponding to the received phase shifted digital signal 375.

In some examples, the digital buffer component 380 is arranged to output an actuation signal 355 comprising a substantially fixed amplitude. In some further examples, it is contemplated that the digital buffer component 380 is arranged to output an actuation signal comprising a configurable fixed amplitude.

Thus, an example of a drive-mode oscillator module 240 has been described that enables the power consumption of the MEMS device 200 to be significantly reduced when operating in a standby mode, whilst enabling the oscillation of the proof-mass 210 to remain actuated. Significantly, in some examples it has been found that the current consumption during standby mode has been reduced from around 929 μA using a conventional high gain accuracy analogue drive-mode oscillator to around 195 μA; a reduction in current consumption of approximately 80%.

Figure 4:
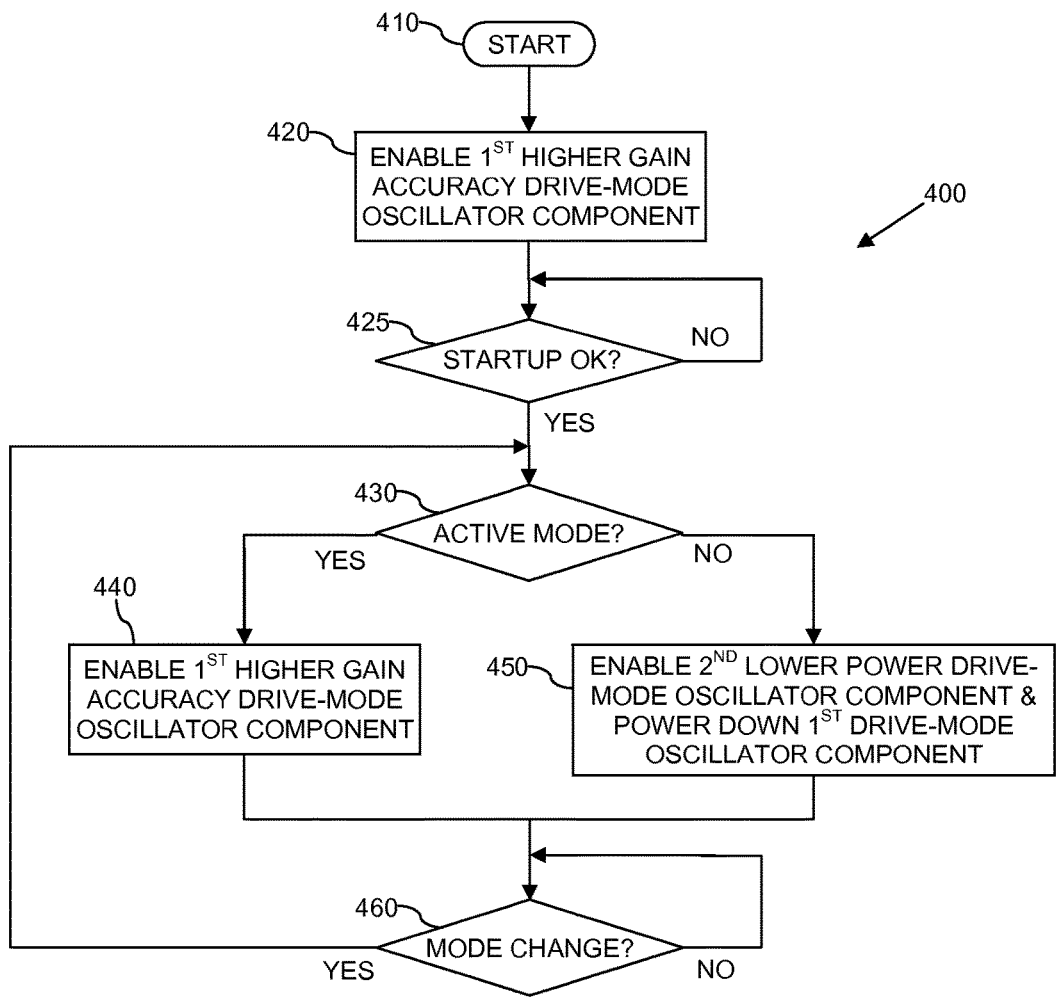
FIG. 4 illustrates a simplified flowchart of an example of a method of generating an actuation signal for a proof-mass within an micro-electro-mechanical system (MEMS) device.

Referring now to FIG. 4, there is illustrated a simplified flowchart 400 of an example of a method of generating an actuation signal for a proof-mass within an micro-electro-mechanical system, MEMS, device, such as may be implemented within the MEMS device 200 of FIG. 2. The method starts at 410, and moves on to 420 where a first, higher gain accuracy drive-mode oscillator component is initially configured to generate the actuation signal for the proof-mass during start-up in order to achieve a required oscillating displacement range for the proof-mass. Upon the required oscillating displacement range for the proof-mass being achieved, at 425, the method moves on to 430. If it is determined that the MEMS device is operating in an active mode, the method moves on to 440, where a first, higher gain accuracy drive-mode oscillator component is configured to generate the actuation signal for the proof-mass during the active mode of the MEMS device. Conversely, if it is determined that the MEMS device is operating in a standby mode, the method moves on to 450, where the first, higher gain accuracy drive-mode oscillator component is powered down and a second, lower power consumption drive-mode oscillator component is configured to generate the actuation signal for the proof-mass during a standby mode of the MEMS device. In the illustrated example, if a subsequent mode change is determined, at 460, the method loops back to 430.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected', or 'operably coupled', to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an', as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an'. The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A drive-mode oscillator module for use within a micro-electro-mechanical system (MEMS) device; the drive-mode oscillator module being arranged to receive a proof-mass measurement signal from a proof-mass of the MEMS device and to output a proof-mass actuation signal to the proof-mass of the MEMS device; wherein the drive-mode oscillator module comprises:

a first, higher gain accuracy drive-mode component for receiving an analogue voltage measurement signal from a capacitance to voltage module, wherein the analogue voltage measurement signal is used in generating an actuation signal during an active mode of the MEMS device, wherein the actuation signal is output by the drive-mode oscillator module during the active mode of the MEMS device; and a second, lower power consumption drive-mode component for receiving a digital clock signal used in generating an actuation signal during a standby mode of the MEMS device, wherein the digital clock signal has a higher frequency than a natural oscillating frequency of the proof-mass, and the actuation signal is output by the drive-mode oscillator module during the standby mode of the MEMS device, wherein the second drive-mode component comprises:
- at least one comparator component arranged to receive the analogue voltage measurement signal for the proof-mass of the MEMS device, and to output an equivalent square wave signal;
- at least one digital phase shifter component arranged to receive the square wave signal output by the comparator component and the digital clock signal, and to output a phase shifted signal; and
- at least one digital buffer component arranged to receive the phase shifted signal and to output an actuation signal corresponding to the received phase shifted signal.

2. The drive-mode oscillator module of claim 1, wherein the second drive-mode component comprises a digital oscillator circuit.

3. The drive-mode oscillator module of claim 1, wherein the at least one digital buffer component is arranged to output an actuation signal comprising a fixed amplitude.

4. The drive-mode oscillator module of claim 3, wherein the at least one digital buffer component is arranged to output an actuation signal comprising a configurable fixed amplitude.

5. The drive-mode oscillator module of claim 1, wherein the first drive-mode component comprises an analogue oscillator circuit.

6. The drive-mode oscillator module of claim 5, wherein the first drive-mode component comprises an integration component arranged to receive the analogue voltage measurement signal for the proof-mass of the MEMS device, and to output a phase shifted signal.

7. The drive-mode oscillator module of claim 6, wherein the first drive-mode component comprises a voltage gain amplifier (VGA) component arranged to receive the phase shifted signal and to output an actuation voltage signal corresponding to the received phase shifted signal.

8. The drive-mode oscillator module of claim 7, wherein the first drive-mode component comprises an automatic gain control (AGC) component arranged to provide a control signal to the VGA component to control an amplitude of the actuation voltage signal output thereby.

9. The drive-mode oscillator module of claim 1, wherein the capacitance to voltage, component is arranged to receive the proof-mass measurement signal comprising an indication of a capacitance change of a MEMS drive measurement unit, DMU, and to convert the received indication of a capacitance change to the analogue voltage measurement signal.

10. The drive-mode oscillator module of claim 1, wherein the drive-mode oscillator module comprises a selector component arranged to selectively output as the proof-mass actuation signal one of the actuation signals output by the first and second drive-mode components in accordance with a control signal.

11. The drive-mode oscillator module of claim 1 implemented within an integrated circuit device comprising at least one die within a single integrated circuit package.

12. A micro-electro-mechanical system (MEMS) device comprising at least one drive-mode oscillator module according to claim 1.

13. A method of generating an actuation signal for a proof-mass within a micro-electro-mechanical system (MEMS) device, the method comprising:
- configuring a first, higher gain accuracy drive-mode component to generate the actuation signal for the proof-mass during an active mode of the MEMS device, wherein the actuation signal is determined using an analogue voltage measurement signal during the active mode; and
- powering down the first, higher gain accuracy drive-mode component and configuring a second, lower power consumption drive-mode component to generate the actuation signal for the proof-mass during a standby mode of the MEMS device, wherein the actuation signal is determined using a digital clock signal having a higher frequency than a natural oscillating frequency of the proof-mass during the standby mode.

14. The method of claim 13 further comprising:
receiving the analogue voltage measurement signal for the proof-mass of the MEMS device and the digital clock signal in a comparator component in the lower power consumption drive-mode component.

15. The method of claim 14 further comprising:
outputting an equivalent square wave signal from the comparator to a digital phase shifter component in the lower power consumption drive-mode component.

16. The method of claim 15 further comprising:
outputting a phase shifted signal from the digital phase shifter component to a digital buffer component.

17. The method of claim 16 further comprising:
outputting an actuation signal corresponding to the received phase shifted signal from the digital buffer component.

* * * * *